US012601969B2

(12) United States Patent　　(10) Patent No.: US 12,601,969 B2
Inoue　　(45) Date of Patent: Apr. 14, 2026

(54) MOLDING APPARATUS, MOLDING METHOD, AND ARTICLE MANUFACTURING METHOD

(71) Applicant: CANON KABUSHIKI KAISHA, Tokyo (JP)

(72) Inventor: Yukio Inoue, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/826,089

(22) Filed: May 26, 2022

(65) Prior Publication Data

US 2022/0390835 A1　　Dec. 8, 2022

(30) Foreign Application Priority Data

Jun. 8, 2021　　(JP) ................................. 2021-096032

(51) Int. Cl.
　　*G03F 7/00*　　(2006.01)
(52) U.S. Cl.
　　CPC .................................. *G03F 7/0002* (2013.01)
(58) Field of Classification Search
　　CPC .................................. G03F 7/0002; G03F 7/00
　　See application file for complete search history.

(56) References Cited

U.S. PATENT DOCUMENTS 8,394,282 B2　　3/2013　Panga et al.
9,415,418 B2　　8/2016　Sreenivasan et al.

2007/0035056 A1*　2/2007　Suehira ............... B29C 35/0888
　　　　　　　　　　　　　　　　　　264/494
2010/0029084 A1*　2/2010　Koshiba .................. B82Y 40/00
　　　　　　　　　　　　　　　　　　156/345.24
2014/0199472 A1　　7/2014　Kodama et al.
2015/0352756 A1*　12/2015　Yamaguchi ........... G03F 7/0002
　　　　　　　　　　　　　　　　　　425/141

(Continued)

FOREIGN PATENT DOCUMENTS

JP　　　2002031895 A　　1/2002
JP　　　2009088376 A　　4/2009

(Continued)

OTHER PUBLICATIONS

JP 2019054210 A english translation (Year: 2019).*

(Continued)

*Primary Examiner* — Joseph S Del Sole
(74) *Attorney, Agent, or Firm* — ROSSI, KIMMS & McDOWELL LLP

(57)　　　　　　ABSTRACT

A molding apparatus that molds a composition on a substrate using a mold, the apparatus including a discharge unit configured to discharge a droplet of the composition to arrange the droplet on the substrate, a measurement unit configured to measure a film thickness of a film of the composition formed on the substrate by molding, using the mold, the droplet of the composition arranged on the substrate, and a control unit configured to obtain, based on the film thickness measured by the measurement unit, a volume of the droplet of the composition having been discharged from the discharge unit and, based on the volume, control the discharge unit such that a fluctuation of the volume of the droplet of the composition discharged from the discharge unit falls within an allowable range.

13 Claims, 6 Drawing Sheets

(56) References Cited

U.S. PATENT DOCUMENTS

| 2017/0368726 A1* | 12/2017 | Shudo | .................. G03F 9/7076 |
| 2018/0008995 A1* | 1/2018 | Baker | .................... H10K 71/00 |
| 2019/0258158 A1* | 8/2019 | Kawasaki | ............. G03F 7/0002 |
| 2019/0265586 A1* | 8/2019 | Jung | ..................... G03F 7/0017 |
| 2020/0110333 A1 | 4/2020 | Yoshida et al. | |
| 2021/0039131 A1 | 2/2021 | Shimmura et al. | |
| 2021/0149297 A1* | 5/2021 | Hayashi | ............... G03F 7/0002 |

FOREIGN PATENT DOCUMENTS

| JP | 2010158636 A | | 7/2010 | | |
| JP | 2015021904 A | | 2/2015 | | |
| JP | 2016111367 A | * | 6/2016 | .......... | G03F 7/0002 |
| JP | 2016119417 A | | 6/2016 | | |
| JP | 2017092318 A | | 5/2017 | | |
| JP | 2019054210 A | * | 4/2019 | ............ | B29C 35/08 |
| JP | 2021015912 A | | 2/2021 | | |
| KR | 1020140068977 A | | 6/2014 | | |
| KR | 1020190101777 A | | 9/2019 | | |
| KR | 1020200040679 A | | 4/2020 | | |
| TW | 202121560 A | | 6/2021 | | |
| WO | 2019123993 A1 | | 6/2019 | | |

OTHER PUBLICATIONS

JP 2016111367 A, english translation (Year: 2016).*
Office Action issued in Taiwanese Appln. No. 111119471, mailed May 1, 2024. English translation provided.
Office Action issued in Taiwanese Appln. No. 111119471 dated on Sep. 30, 2024. English translation provided.

* cited by examiner

F I G.  2A
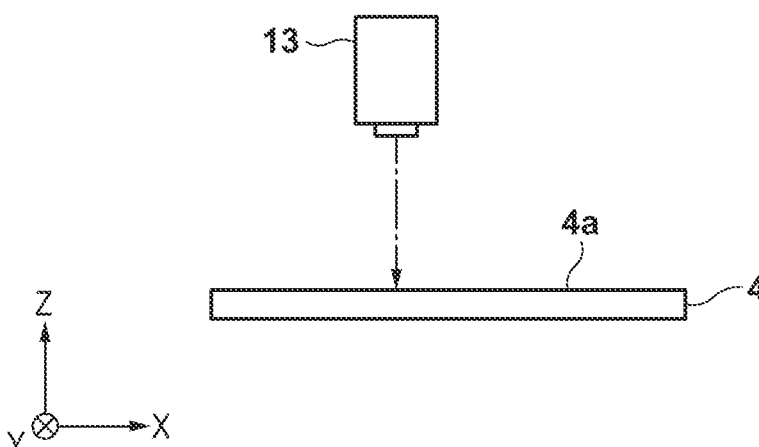
F I G.  2B
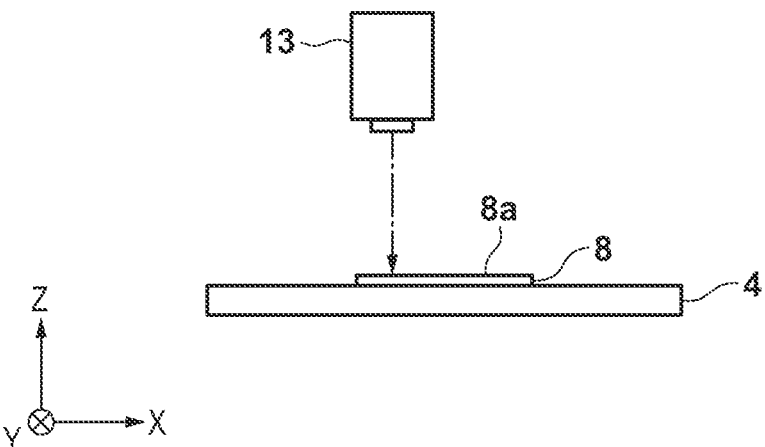
F I G.  2C
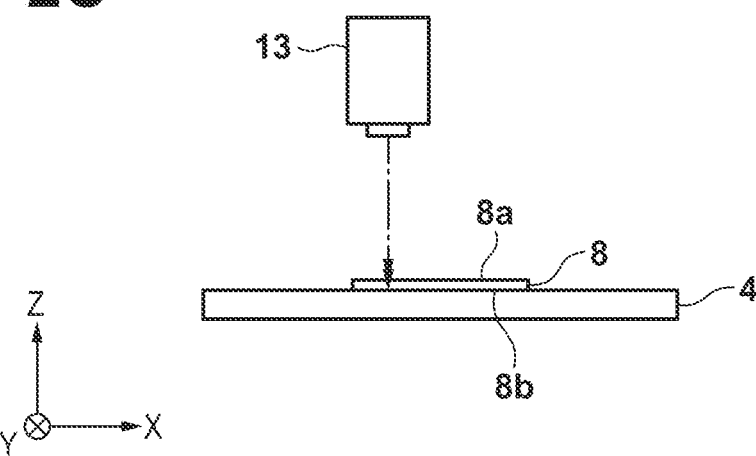

F I G. 5A
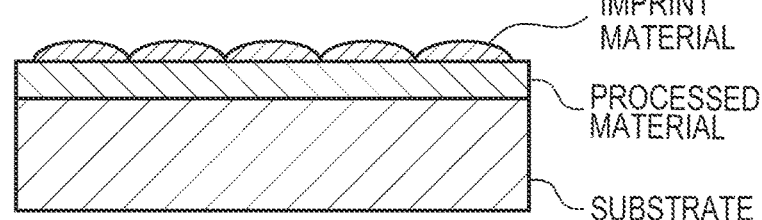
IMPRINT
MATERIAL
PROCESSED
MATERIAL
SUBSTRATE
F I G. 5B
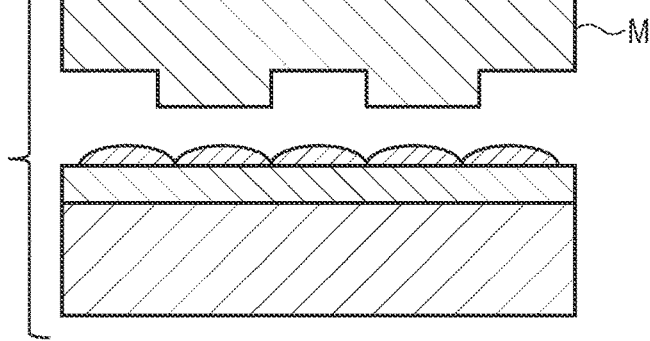
MOLD
F I G. 5C
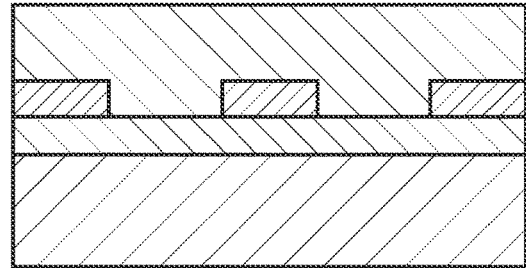
F I G. 5D
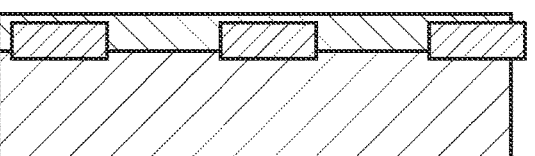
F I G. 5E
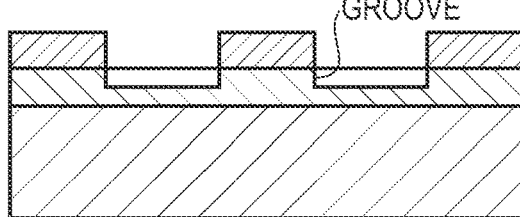
GROOVE
F I G. 5F
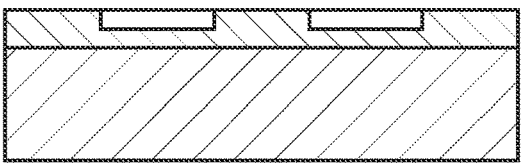

F I G. 6A
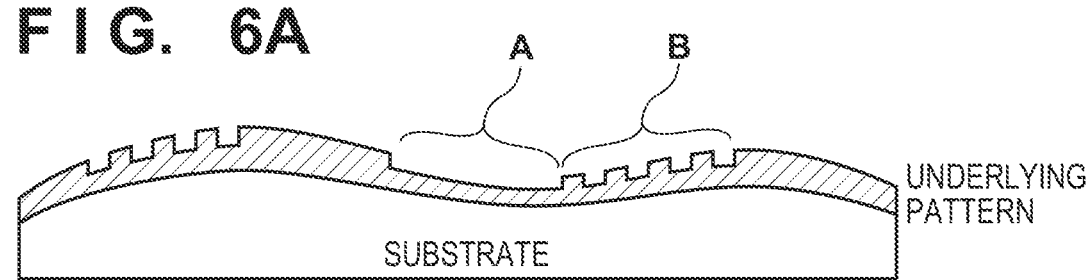
F I G. 6B
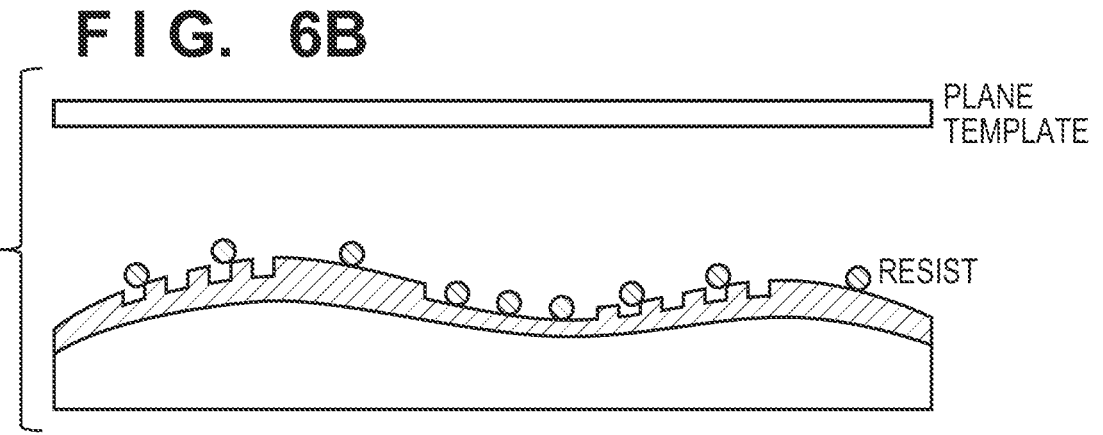
F I G. 6C
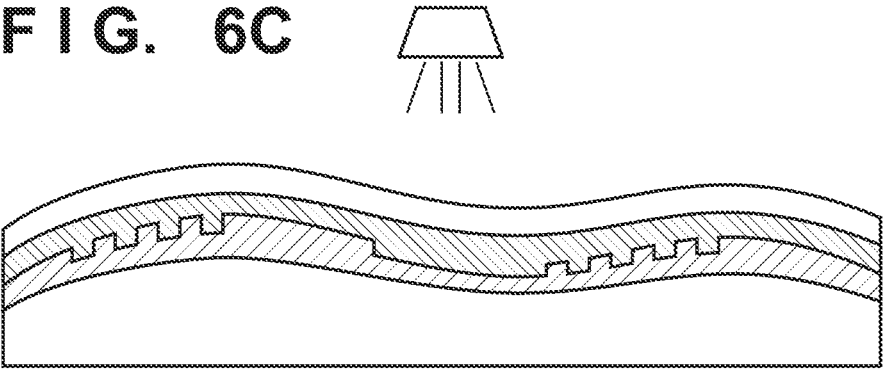
F I G. 6D
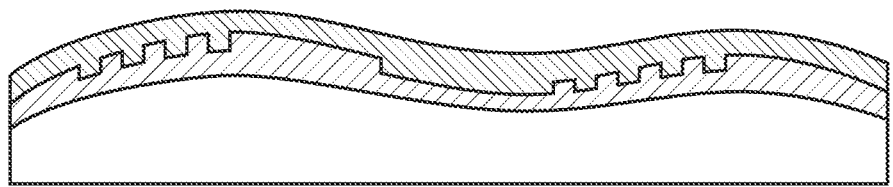

MOLDING APPARATUS, MOLDING METHOD, AND ARTICLE MANUFACTURING METHOD

BACKGROUND OF THE INVENTION

Field of the Invention

The present invention relates to a molding apparatus, a molding method, and an article manufacturing method.

Description of the Related Art

There is known a microfabrication technique that forms a pattern on a substrate by an imprint process in which an imprint material (composition) on the substrate is molded using a mold. This technique is also called an imprint technique, and a pattern (structure) on the order of nm can be formed on a substrate.

In the imprint technique, one example of the method of curing an imprint material is a photo-curing method. In the imprint apparatus that employs the photo-curing method, an imprint material is arranged (supplied) on a substrate and, in a state in which the imprint material is in contact with a mold, light is applied to cure the imprint material. Then, the mold is separated from the cured imprint material on the substrate to form a pattern of the imprint material on the substrate. Note that another example of the method of curing an imprint material is a heat-curing method that cures an imprint material by heat.

In the imprint apparatus, a dispenser is generally used to arrange an imprint material on a substrate. The dispenser is one component of a liquid discharge apparatus and, for example, a mechanism for discharging droplets of the imprint material by an inkjet method. The specific configurations of the dispenser are similar to those of an inkjet head generally used in an inkjet printer.

In the imprint apparatus, in order to accurately form a pattern on a substrate, it is necessary to keep constant the volume of the droplet of the imprint material discharged from the dispenser. However, in the dispenser, due to a change of the pressure in the dispenser, a deterioration of a driving unit such as a piezoelectric element, adhesion of a foreign matter, or the like, the state of a portion that discharges the imprint material may change and the volume of the droplet of the imprint material discharged from the dispenser may fluctuate. To prevent this, Japanese Patent Laid-Open No. 2002-31895 proposes a technique of measuring the film thickness of a photosensitive agent on a substrate, which is a technique related to an exposure apparatus but considered to be applicable to an imprint apparatus.

However, the technique disclosed in Japanese Patent Laid-Open No. 2002-31895 measures the film thickness of the photosensitive agent by a measurement apparatus (external apparatus) outside the exposure apparatus, so that it requires time to feed back (reflect) the measurement result to the exposure condition such as the integrated exposure amount. The problem as described above also occurs when the technique disclosed in Japanese Patent Laid-Open No. 2002-31895 is applied to an imprint apparatus, for example, when a measurement apparatus outside the imprint apparatus measures the film thickness of the imprint material and feeds back the measurement result to the control of the dispenser.

SUMMARY OF THE INVENTION

The present invention provides a molding apparatus advantageous in feedback control of the volume of a droplet of an imprint material discharged toward a substrate.

According to one aspect of the present invention, there is provided a molding apparatus that molds a composition on a substrate using a mold, the apparatus including a discharge unit configured to discharge a droplet of the composition to arrange the droplet on the substrate, a measurement unit configured to measure a film thickness of a film of the composition formed on the substrate by molding, using the mold, the droplet of the composition arranged on the substrate, and a control unit configured to obtain, based on the film thickness measured by the measurement unit, a volume of the droplet of the composition having been discharged from the discharge unit and, based on the volume, control the discharge unit such that a fluctuation of the volume of the droplet of the composition discharged from the discharge unit falls within an allowable range.

Further aspects of the present invention will become apparent from the following description of exemplary embodiments with reference to the attached drawings.

BRIEF DESCRIPTION OF THE DRAWINGS

FIGS. 2A to 2C are views for describing detailed configurations and functions of a measurement unit.

FIGS. 5A to 5F are views for describing an article manufacturing method.

FIGS. 6A to 6D are views for describing a case in which the imprint apparatus shown in FIG. 1 is used as a planarization apparatus.

DESCRIPTION OF THE EMBODIMENTS

Figure 1:
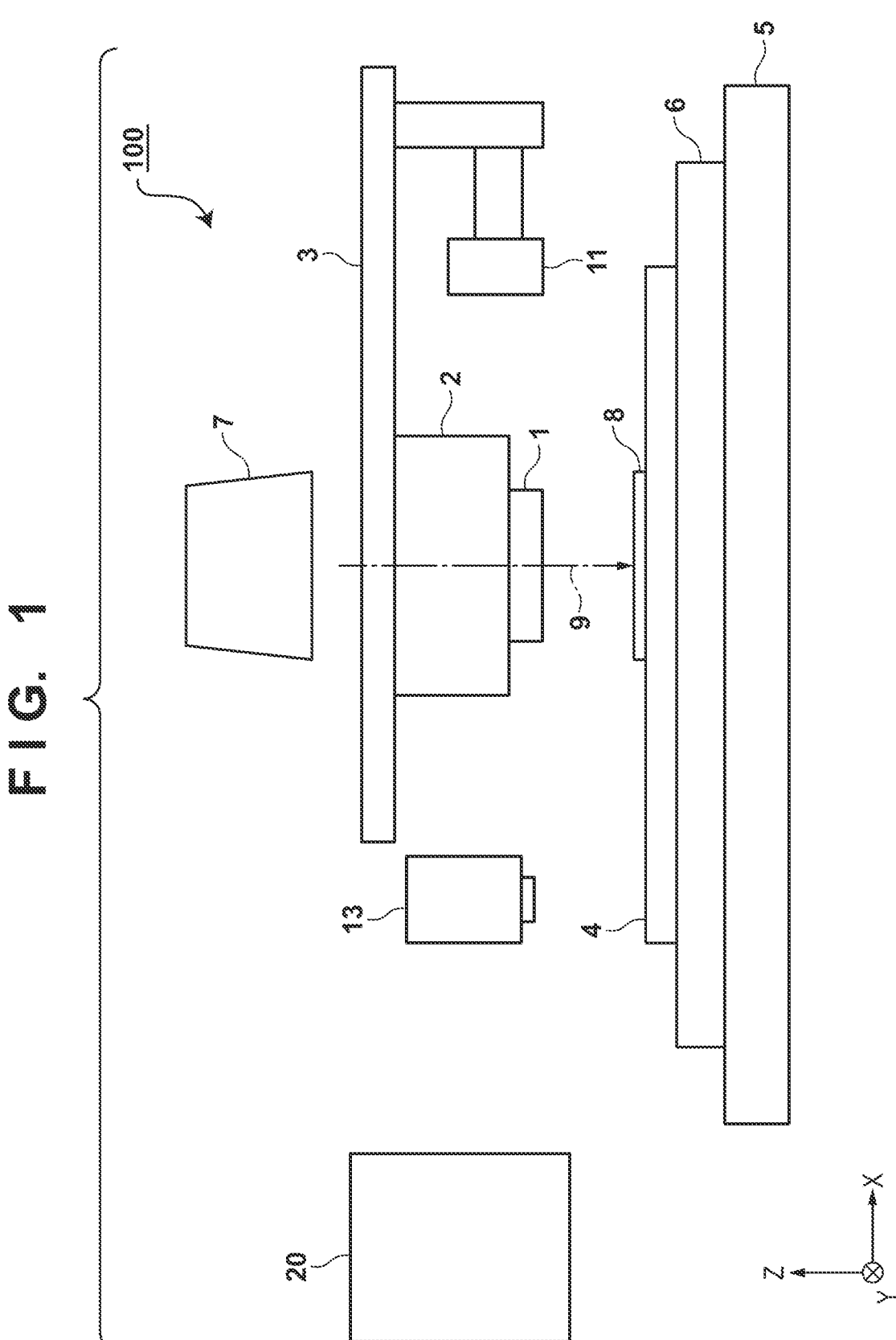
FIG. 1 is a schematic view illustrating configurations of an imprint apparatus according to an aspect of the present invention.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

FIG. 1 is a schematic view illustrating configurations of an imprint apparatus 100 according to an aspect of the present invention. The imprint apparatus 100 is a lithography apparatus that is employed in a lithography step, which is a manufacturing step of a device such as a semiconductor device, a liquid crystal display device, a magnetic storage medium, or the like serving as an article, and forms a pattern on a substrate. The imprint apparatus 100 functions as a molding apparatus that uses a mold to mold an imprint material as a composition on a substrate. In this embodiment, the imprint apparatus 100 brings an uncured imprint material arranged (supplied) on a substrate into contact with a mold and applies curing energy to the imprint material, thereby forming a pattern of a cured product to which a pattern of the mold has been transferred.

As the imprint material, a material (curable composition) to be cured by receiving curing energy is used. An example of the curing energy that is used is electromagnetic waves, heat, or the like. As the electromagnetic waves, for example, infrared light, visible light, ultraviolet light, and the like selected from the wavelength range of 10 nm (inclusive) to 1 mm (inclusive) is used.

The curable composition is a composition cured by light irradiation or heating. The photo-curable composition cured by light irradiation contains at least a polymerizable compound and a photopolymerization initiator, and may contain a nonpolymerizable compound or a solvent, as needed. The nonpolymerizable compound is at least one type of material selected from a group comprising of a sensitizer, a hydrogen donor, an internal mold release agent, a surfactant, an antioxidant, a polymer component, and the like.

The imprint material may be applied, onto the substrate, in a droplet shape or in an island or film shape formed by connecting a plurality of droplets using a liquid injection head. The viscosity (the viscosity at 25° C.) of the imprint material is, for example, 1 mPa·s (inclusive) to 100 mPa·s (inclusive).

As the substrate, glass, ceramic, a metal, a semiconductor, a resin, or the like is used, and a member made of a material different from that of the substrate may be formed on the surface of the substrate, as needed. More specifically, examples of the substrate include a silicon wafer, a semiconductor compound wafer, silica glass, and the like.

In this embodiment, the imprint apparatus 100 employs a photo-curing method as a method of curing an imprint material. Note that the imprint apparatus 100 can also employ a curing method of curing an imprint material by another energy (for example, heat).

In the specification and the accompanying drawings, directions will be indicated on an XYZ coordinate system in which directions parallel to the surface of a substrate are defined as the X-Y plane. Directions parallel to the X-axis, the Y-axis, and the Z-axis of the XYZ coordinate system are the X direction, the Y direction, and the Z direction, respectively. A rotation about the X-axis, a rotation about the Y-axis, and a rotation about the Z-axis are OX, OY, and OZ, respectively.

The imprint apparatus 100 includes an irradiation unit 7, a mold holding unit 2, a substrate stage 6, a dispenser 11, a measurement unit 13, and a control unit 20. The imprint apparatus 100 also includes a conveyance mechanism (not shown) that has a function of loading a substrate 4 to the substrate stage 6 and a function of unloading the substrate 4 from the substrate stage 6.

The irradiation unit 7 adjusts light 9 (for example, ultraviolet light) emitted from a light source (not shown) to a state suitable for an imprint process, and applies it to an imprint material 8 on the substrate via a mold 1. The light source includes, for example, a mercury lamp that generates i-line or g-line. However, the light source is not limited to this, and can be any light source as long as it emits light having a wavelength to pass through the mold 1 and cure the imprint material 8. Note that when the imprint apparatus 100 employs the heat-curing method, in place of the irradiation unit 7, a heating unit for curing the imprint material 8 is provided, for example, in the vicinity of the substrate stage 6.

The mold 1 is also called a mold, and has a rectangular planar shape. The mold 1 includes a fine concave-convex pattern formed three-dimensionally in a central portion of the surface facing the substrate 4. The mold 1 is made of a material, for example, quartz or the like capable of transmitting the light 9 emitted from the irradiation unit 7.

The mold holding unit 2 is supported by a structure 3. The mold holding unit 2 includes, for example, a mold chuck that holds the mold 1, and a mold driving mechanism that supports and drives the mold chuck. The mold chuck holds the mold 1 by chucking, with a vacuum suction force or an electrostatic force, the outer peripheral region of the incident surface of the mold 1 where the light 9 from the irradiation unit 7 enters. The mold driving mechanism drives the mold 1 (the mold chuck holding the mold 1) in the Z direction to bring the imprint material 8 on the substrate and the mold 1 into contact with each other or separate the mold 1 from the imprint material 8 on the substrate. Note that an operation of bringing the imprint material 8 on the substrate and the mold 1 into contact with each other and an operation of separating the mold 1 from the imprint material 8 on the substrate may be implemented by driving the substrate 4 (the substrate stage 6 holding the substrate 4) in the Z direction. Alternatively, the operation of bringing the imprint material 8 on the substrate and the mold 1 into contact with each other and the operation of separating the mold 1 from the imprint material 8 on the substrate may be implemented by relatively driving both the mold 1 and the substrate 4 in the Z direction.

In this embodiment, the substrate 4 is a substrate made of single-crystal silicon. Note that for an application of manufacturing an article other than a semiconductor device, for example, for manufacturing an optical element, the substrate 4 employs optical glass such as quartz, and for manufacturing a light emitting element, the substrate 4 employs GaN, SiC, or the like.

The substrate stage 6 is a stage that can drive on a stage base 5 in the X-Y plane while holding the substrate 4. The substrate stage 6 is used for positioning of the substrate 4 with respect to the mold 1, that is, alignment between the mold 1 and the substrate 4 upon bringing the imprint material 8 on the substrate and the mold 1 into contact with each other.

The dispenser 11 is supported by the structure 3, and supplies the imprint material 8 onto the substrate. The dispenser 11 has a function as a discharge unit that discharges droplets of the imprint material 8 and arranges the droplets of the imprint material 8 in a desired drop pattern in a shot region (a section region in which a pattern is to be formed) on the substrate. The imprint material 8 is required to have fluidity when it is filled between the mold 1 and the substrate 4, and be solid (keep the shape) after being molded using the mold 1. In this embodiment, the imprint material 8 is photo-curable and cured by irradiation of the light 9, but the imprint material 8 is heat-curable or thermoplastic in accordance with various kinds of conditions in the article manufacturing step or the like.

The measurement unit 13 is provided inside the imprint apparatus 100 (to be referred to as "in the apparatus" hereinafter). The measurement unit 13 measures the film thickness of a film of the imprint material 8 formed on the substrate by molding, using the mold 1, the droplets of the imprint material 8 discharged from the dispenser 11 and arranged on the substrate. In this embodiment, the measurement unit 13 measures, in the apparatus, the film thickness of the film of the imprint material 8 in a period after the film of the imprint material 8 is formed on the substrate held by the substrate stage 6 and before the substrate 4 is unloaded from the substrate stage 6. The configurations and functions of the measurement unit 13 will be described later in detail.

The control unit 20 is formed by a computer including a CPU, a memory, and a like, and controls respective units of the imprint apparatus 100 in accordance with programs stored in the memory. The control unit 20 controls the operations and adjustment of the respective units of the imprint apparatus 100 to perform the imprint process of forming the pattern of the imprint material 8 on the substrate using the mold 1. Further, in this embodiment, the control unit 20 calculates the volume (volume per droplet) of the droplet of the imprint material 8 having been discharged from the dispenser 11. Then, based on the calculated volume of the droplet of the imprint material 8, the control unit 20 controls (feedback-controls) the dispenser 11 such that the fluctuation of the droplet of the imprint material 8 discharged from the dispenser 11 falls within an allowable range. The control unit 20 may be formed integrally with the remaining portions of the imprint apparatus 100 (in a common housing), or may be formed separately from the remaining portions of the imprint apparatus 100 (in another housing).

A general operation of the imprint apparatus 100, that is, the imprint process will be schematically described. First, the control unit 20 loads the substrate 4 to the imprint apparatus 100 via the conveyance mechanism and causes the substrate stage 6 to hold the substrate 4. Then, the control unit 20 drives the substrate stage 6 such that the shot region (the shot region serving as the target of the imprint process) of the substrate 4 is located at the position facing the dispenser 11. Here, the control unit 20 causes the dispenser 11 to discharge droplets of the imprint material 8, each droplet having a predetermined amount, while driving the substrate stage 6 below the dispenser 11, thereby arranging the droplets of the imprint material 8 on the shot region of the substrate 4 (arrangement step).

Next, the control unit 20 drives the substrate stage 6 such that the shot region (the shot region where the droplets of the imprint material 8 are arranged) of the substrate 4 is located at the position facing the mold 1 (pattern thereof). Then, the control unit 20 drives the mold holding unit 2 in the Z direction (downward) to bring the mold 1 and the substrate 4 close to each other. In this state, the control unit 20 detects marks provided in the mold 1 and the substrate 4, respectively, by an alignment scope (not shown). Based on the detection result of the alignment scope, the control unit 20 drives the substrate stage 6 in the X direction and the Y direction to adjust the relative position between the mold 1 and the substrate 4 (align the mold 1 and the substrate 4).

Next, the control unit 20 drives the mold holding unit 2 in the Z direction so as to decrease the spacing between the mold 1 and the substrate 4, and brings the imprint material 8 (droplets thereof) on the substrate and the mold 1 (pattern thereof) into contact with each other (contact step). Then, in a state in which the imprint material 8 on the substrate and the mold 1 are in contact with each other, the control unit 20 irradiates the imprint material 8 with the light 9 from the irradiation unit 7 to cure the imprint material 8 (curing step). Then, the control unit 20 drives the mold holding unit 2 in the Z direction (upward) so as to increase the spacing between the mold 1 and the substrate 4, thereby separating the mold 1 from the cured imprint material 8 on the substrate (separation step). With this, the pattern corresponding to the pattern of the mold 1 is formed (transferred) in the imprint material 8 on the substrate. Thereafter, the control unit 20 unloads the substrate 4 from the substrate stage 6 (imprint apparatus 100) via the conveyance mechanism, and the imprint process is terminated.

FIGS. 2A to 2C are views for describing the detailed configurations and functions of the measurement unit 13. For example, as shown in FIGS. 2A to 2C, the measurement unit 13 is formed by a distance measurement sensor such as spectroscopic interferometer. In this case, it is preferable that the wavelength of the light emitted from the light source of the distance measurement sensor (measurement unit 13) toward the substrate 4 and the imprint material 8 is not a wavelength of curing the imprint material 8.

With reference to FIGS. 2A to 2C, an example of the measurement process of measuring the film thickness of the film of the imprint material 8 formed on the substrate by the measurement unit 13 formed by the distance measurement sensor will be described. Note that the discharge amount of the droplet of the imprint material 8 discharged from the dispenser 11 changes in accordance with the drop pattern. Therefore, the film thickness of the film of the imprint material 8 formed on the substrate is preferably measured for each drop pattern or measured while setting the drop pattern serving as a reference.

First, as shown in FIG. 2A, the measurement unit 13 measures the distance (first distance) between the measurement unit 13 and a surface 4a of the substrate 4 before the imprint process, that is, the surface 4a of the substrate 4 before the droplets of the imprint material 8 are arranged. Then, as shown in FIG. 2B, the measurement unit 13 measures the distance (second distance) between the measurement unit 13 and an upper surface 8a of the imprint material 8 on the substrate after the imprint process, that is, the upper surface 8a of the film of the imprint material 8 formed on the substrate. Then, the difference between the measurement result of the surface 4a of the substrate 4 before the imprint process and the measurement result of the upper surface 8a of the imprint material 8 on the substrate after the imprint process, that is, the difference between the first distance and the second distance is used as the film thickness of the film of the imprint material 8 formed on the substrate.

Further, as shown in FIG. 2C, the measurement unit 13 can measure the film thickness of the film of the imprint material 8 formed on the substrate by simultaneously detecting the reflected light from the upper surface 8a of the imprint material 8 on the substrate after the imprint process and the reflected light from a lower surface 8b thereof. More specifically, the measurement unit 13 first measures the distance (first distance) between the measurement unit 13 and the lower surface 8b (first surface), which is the substrate-side surface, of the film of the imprint material 8 formed on the substrate. Then, the measurement unit 13 measures the distance (second distance) between the measurement unit 13 and the upper surface 8a (second surface), which is the surface on the opposite side of the substrate-side surface, of the film of the imprint material 8 formed on the substrate. Here, the difference between the measurement result of the lower surface 8b of the film of the imprint material 8 and the measurement result of the upper surface 8a of the film of the imprint material 8, that is, the difference between the first distance and the second distance may be used as the film thickness of the film of the imprint material 8. However, when simultaneously detecting the reflected light from the upper surface 8a of the imprint material 8 and the reflected light from the lower surface 8b thereof, since the optical path length becomes longer than in air due to the refractive index of the imprint material 8, the film thickness of the film of the imprint material 8 is corrected in consideration of the refractive index of the imprint material 8. Accordingly, the film thickness of the film of the imprint material 8 is obtained based on the first distance which is the distance between the lower surface 8b of the film of the imprint material 8 and the measurement unit 13, the second distance which is the distance between the upper surface 8a of the film of the imprint material 8 and the measurement unit 13, and the refractive index of the imprint material 8. Note that it is necessary to acquire the refractive index of the imprint material 8 in advance, for example, for each kind of the imprint material 8, as refractive index information indicating the relationship between the kind of the imprint material 8 and the refractive index of the imprint material 8.

Alternatively, the film thickness of the film of the imprint material 8 formed on the substrate may be obtained from the measurement results of a plurality of portions (two or more points) of the substrate 4 and the imprint material 8 obtained by the measurement unit 13. For example, the measurement unit 13 first measures the first distance between the surface 4a of the substrate 4 and the measurement unit 13 for each of a plurality of portions (a first plurality of portions) on the surface of the substrate 4. Then, the measurement unit 13 measures the second distance between the upper surface 8a of the film of the imprint material 8 and the measurement unit 13 for each of a plurality of portions (a second plurality of portions) of the film of the imprint material 8 above the first plurality of portions of the surface 4a of the substrate 4. The difference between the average value of the first distances at the first plurality of portions of the surface 4a of the substrate 4 and the average value of the second distances at the second plurality of portions of the film of the imprint material 8 may be used as the film thickness of the film of the imprint material 8 formed on the substrate. With this, even when an unevenness (underlying pattern or the like) exists on the substrate 4, it is possible to measure the first distance and the second distance while suppressing (averaging) the distance variation depending on the location. Note that the first plurality of portions of the surface 4a of the substrate 4 include, for example, the center portion of the shot region, the outer peripheral portion on the outer periphery of the shot region, and a portion between the center portion and the outer peripheral portion.

On the other hand, this also applies to a case of simultaneously detecting the reflected light from the upper surface 8a of the imprint material 8 and the reflected light from the lower surface 8b thereof. First, the measurement unit 13 measures the first distance between the lower surface 8b of the film of the imprint material 8 and the measurement unit 13 for each of a plurality of portions (a first plurality of portions) of the lower surface 8b of the film of the imprint material 8 formed on the substrate. Then, the measurement unit 13 measures the second distance between the upper surface 8a of the film of the imprint material 8 and the measurement unit 13 for each of a plurality of portions (a second plurality of portions) of the upper surface 8a above the first plurality of portions of the lower surface 8b of the film of the imprint material 8. Then, based on the average value of the first distances at the first plurality of portions of the lower surface 8b of the film of the imprint material 8, the average value of the second distances at the second plurality of portions of the upper surface 8a of the film of the imprint material 8, and the refractive index of the imprint material 8, the film thickness of the film of the imprint material 8 is obtained.

Once the film thickness of the film of the imprint material 8 formed on the substrate is measured as described above, the control unit 20 obtains, based on the film thickness of the film of the imprint material 8 measured by the measurement unit 13, the volume of the droplet of the imprint material 8 having been discharged from the dispenser 11. The volume of the droplet of the imprint material 8 can be calculated from the number of the droplets of the imprint material 8 having been discharged from the dispenser 11, the film thickness of the film of the imprint material 8 measured by the measurement unit 13, and the area of the shot region (the area of the region on which the film of the imprint material 8 is formed). For example, let N [pcs] be the number of the droplets of the imprint material 8 having been discharged from the dispenser 11, t [m] be the film thickness of the film of the imprint material 8 measured by the measurement unit 13, and S [m$^2$] be the area of the shot region. In this case, the volume of the droplet of the imprint material 8 is calculated from a calculation formula expressed by t [m]×S [m$^2$]/N [pcs].

The control unit 20 stores the volume of the droplet of the imprint material 8 calculated from the film thickness of the film of the imprint material 8 measured by the measurement unit 13 to grasp the fluctuation (transition thereof) of the volume of the droplet of the imprint material 8 discharged from the dispenser 11. Then, the control unit 20 controls (feedback-controls) the dispenser 11 such that the fluctuation of the volume of the droplet of the imprint material 8 discharged from the dispenser 11 falls within the allowable range. For example, with respect to the optimum volume of the droplet of the imprint material 8, if the fluctuation amount of the droplet of the imprint material 8 discharged from the dispenser 11 exceeds ±5%, the control unit 20 controls (adjusts) the volume of the droplet of the imprint material 8 discharged from the dispenser 11. More specifically, with respect to the optimum volume of the droplet of the imprint material 8, if the volume of the droplet of the imprint material 8 discharged from the dispenser 11 decreases 5% or more, the control unit 20 increases the volume of the droplet of the imprint material 8 discharged from the dispenser 11 by the decreased amount. On the other hand, with respect to the optimum volume of the droplet of the imprint material 8, if the volume of the droplet of the imprint material 8 discharged from the dispenser 11 increases 5% or more, the control unit 20 decreases the volume of the droplet of the imprint material 8 discharged from the dispenser 11 by the increased amount. Note that the figure "5%" is merely an example, and an arbitrary figure can be set in accordance with the operation status of the imprint apparatus 100. An example of the method of controlling the volume of the droplet of the imprint material 8 discharged from the dispenser 11 is a method of changing the voltage applied to the piezoelectric element (not shown) which is driven when discharging the droplet of the imprint material 8 from the dispenser 11.

In this embodiment, the film thickness of the film of the imprint material 8 formed on the substrate is measured by the measurement unit 13 provided in the apparatus, and the volume of the droplet of the imprint material 8 having been discharged from the dispenser 11 is obtained based on the film thickness to feedback-control the dispenser 11. Therefore, it is unnecessary to unload, from the imprint apparatus 100, the substrate 4 on which the film of the imprint material 8 has been formed and measure the film thickness of the film of the imprint material 8 by a measurement apparatus (external apparatus) outside the imprint apparatus. Accordingly, the measurement result of the measurement unit 13 can be fed back to the dispenser 11 (the control of the volume of the droplet of the imprint material 8 discharged therefrom) in a short time. In other words, as compared to the related art, this embodiment can significantly shorten the time required for the feedback control of the dispenser 11.

Further, it is possible to keep constant the volume of the droplet of the imprint material 8 discharged from the dispenser 11, and it can be suppressed (prevented) that the fluctuation of the volume of the droplet of the imprint material 8 disables the formation of a good pattern on the substrate 4.

Note that as the time elapses, part of the droplet of the imprint material 8 discharged from the dispenser 11 and arranged on the substrate 4 volatilizes and the volume thereof decreases. Therefore, it is preferable to make the fluctuation of the volume of the droplet of the imprint material 8 discharged from the dispenser 11 fall within the allowable range also based on the volatilization amount of the imprint material 8 from the arrangement of the droplet of the imprint material 8 on the substrate to the formation of the film of the imprint material 8. Particularly, a change in time from the arrangement of the droplet of the imprint material 8 on the substrate to the formation of the film of the imprint material 8 is highly correlated with a change in film thickness of the imprint material 8 formed on the substrate. Hence, it is effective to control (correct) the volume of the droplet of the imprint material 8 discharged from the dispenser 11 while considering the volatilization amount of the imprint material 8. More specifically, for example, data indicating the relationship between the time from the arrangement of the droplet of the imprint material 8 on the substrate by the dispenser 11 to the formation of the film of the imprint material 8 and the film thickness of the film of the imprint material 8 formed on the substrate is acquired in advance. When feedback-controlling the dispenser 11, the volume of the droplet of the imprint material 8 discharged from the dispenser 11 is controlled also based on this data. Note that a factor other than the time from the arrangement of the droplet of the imprint material 8 on the substrate to the formation of the film of the imprint material 8 may also be considered.

Figure 3:
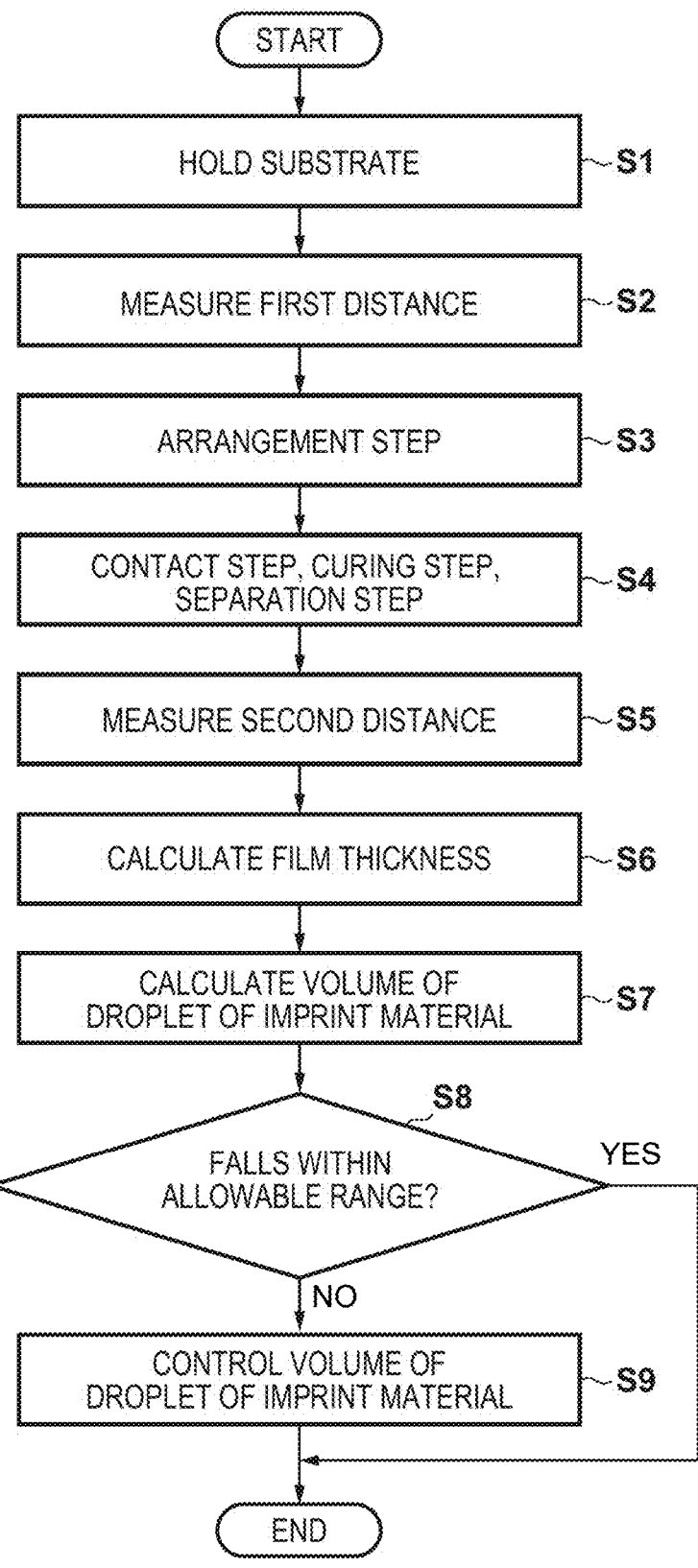
FIG. 3 is a flowchart for describing an example of an imprint process in an embodiment.

An example of the imprint process including the feedback control of the dispenser 11 in this embodiment will be described below with reference to FIG. 3. Here, the description will be given while taking, as an example, the sequence of obtaining the film thickness of the film of the imprint material 8 by measuring the first distance between the surface 4a of the substrate 4 before the imprint process and the measurement unit 13 and the second distance between the upper surface 8a of the imprint material 8 on the substrate after the imprint process and the measurement unit 13.

In step S1, the substrate 4 is conveyed to the substrate stage 6, and the substrate stage 6 holds the substrate 4. In step S2, for the substrate 4 held by the substrate stage 6, the measurement unit 13 measures the first distance between the measurement unit 13 and the surface 4a of the substrate 4 before the arrangement of droplets of the imprint material 8.

In step S3, droplets of the imprint material 8 are discharged from the dispenser 11 to arrange the droplets of the imprint material 8 on the substrate (arrangement step). In step S4, the imprint material 8 on the substrate and the mold 1 are brought into contact with each other (contact step), the imprint material 8 on the substrate is cured in this state (curing step), and the mold 1 is separated from the cured imprint material 8 on the substrate (separation step). With this, a pattern (film) of the imprint material 8 is formed on the substrate. The imprint process including the arrangement step, the contact step, the curing step, and the separation step is performed on shot regions on the substrate, which are set in advance, and the pattern of the imprint material 8 is formed on each of these shot regions.

In step S5, for the substrate 4 on which the pattern of the imprint material 8 has been formed, the measurement unit 13 measures the second distance between the measurement unit 13 and the upper surface 8a of the film of the imprint material 8 formed on the substrate.

In step S6, the film thickness of the film of the imprint material 8 formed on the substrate is calculated. More specifically, the difference between the first distance measured in step S2 and the second distance measured in step S5 is calculated as the film thickness of the film of the imprint material 8 formed on the substrate.

In step S7, based on the film thickness of the film of the imprint material 8 calculated in step S6, the volume of the droplet of the imprint material 8 having been discharged from the dispenser 11 is calculated. More specifically, the volume of the droplet of the imprint material 8 is calculated from the number of the droplets of the imprint material 8 having been discharged from the dispenser 11 in step S3, the film thickness of the film of the imprint material 8 calculated in step S6, and the area of the shot region on which the pattern of the imprint material 8 has been formed in step S4.

In step S8, based on the volume of the droplet of the imprint material 8 calculated in step S7, it is determined whether the fluctuation of the volume of the droplet of the imprint material 8 having been discharged from the dispenser 11 falls within the allowable range. If the fluctuation of the volume of the droplet of the imprint material 8 having been discharged from the dispenser 11 falls within the allowable range, the process is terminated without changing the volume of the droplet of the imprint material 8 discharged from the dispenser 11. On the other hand, if the fluctuation of the volume of the droplet of the imprint material 8 having been discharged from the dispenser 11 does not fall within the allowable range, the process transitions to step S9.

In step S9, based on the volume of the droplet of the imprint material 8 calculated in step S7, the volume of the droplet of the imprint material 8 discharged from the dispenser 11 is controlled (changed) such that the fluctuation of the volume of the droplet of the imprint material 8 discharged from the dispenser 11 falls within the allowable range. For example, when the dispenser 11 is a piezoelectric type, the volume of the droplet of the imprint material 8 discharged from the dispenser 11 can be controlled by changing the voltage applied to the piezoelectric element. Note that the timing of controlling the volume of the droplet of the imprint material 8 discharged from the dispenser 11 may be the lot basis or the substrate basis.

Figure 4:
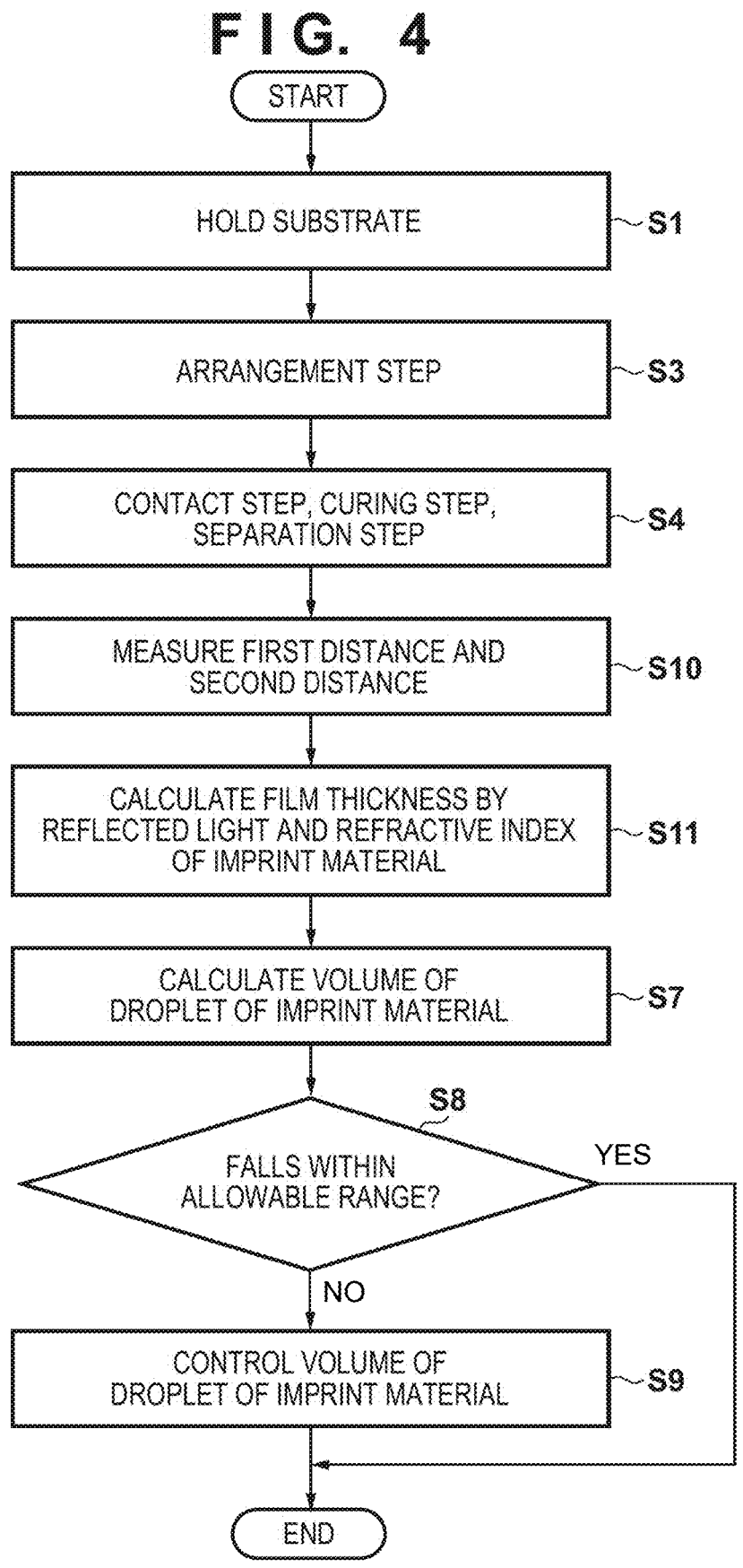
FIG. 4 is a flowchart for describing another example of the imprint process in the embodiment.

Note that, as has been described with reference to FIG. 2C, the film thickness of the imprint material 8 formed on the substrate may be obtained by simultaneously detecting the reflected light from the upper surface 8a of the imprint material 8 and the reflected light from the lower surface 8b thereof. In this case, as illustrated in FIG. 4, steps S10 and S11 are performed in place of steps S2, S5, and S6 illustrated in FIG. 3. In step S10, for the substrate 4 held by the substrate stage 6 and formed with the film of the imprint material 8 thereon, the measurement unit 13 measures the first distance between the lower surface 8b of the film of the imprint material 8 and the measurement unit 13 and the second distance between the upper surface 8a of the imprint material 8 and the measurement unit 13. In step S11, the film thickness of the film of the imprint material 8 formed on the substrate is calculated. More specifically, the film thickness of the film of the imprint material 8 formed on the substrate is calculated from the difference between the first distance and the second distance calculated in step S10 and the refractive index of the imprint material 8.

As has been described above, according to this embodiment, since the measurement result of the measurement unit 13 provided in the apparatus is fed back to the dispenser 11 in a short time, the time required for the feedback control of the dispenser 11 can be significantly shortened. Further, in the imprint process, it is possible to keep constant the volume of the droplet of the imprint material 8 discharged from the dispenser 11, and it can be suppressed that the fluctuation of the volume of the droplet of the imprint material 8 disables the formation of a good pattern on the substrate 4.

The pattern of a cured product formed using the imprint apparatus 100 is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, a SRAM, a flash memory, and a MRAM and semiconductor elements such as an LSI, a CCD, an image sensor, and an FPGA. Examples of the mold are molds for imprint.

The pattern of the cured product is directly used as the constituent member of at least some of the above-described articles or used temporarily as a resist mask. After etching or ion implantation is performed in the substrate processing step, the resist mask is removed.

A detailed article manufacturing method will be described next. As shown in FIG. 5A, a substrate such as a silicon wafer with a work material such as an insulator formed on the surface is prepared, and an imprint material is applied to the surface of the work material by an ink-jet method or the like. A state in which the imprint material formed as a film continuously covering the surface of the substrate is applied onto the substrate is shown here.

As shown in FIG. 5B, a side of the mold for imprint with a projection and groove pattern is formed on and caused to face the imprint material on the substrate. As illustrated in FIG. 5C, the substrate to which the imprint material is applied is brought into contact with the mold, and a pressure is applied. The gap between the mold and the processed material is filled with the imprint material. In this state, when the imprint material is irradiated with light serving as curing energy through the mold, the imprint material is cured.

As shown in FIG. 5D, after the imprint material is cured, the mold is released from the substrate. Thus, the pattern of the cured product of the imprint material is formed on the substrate. In the pattern of the cured product, the groove of the mold corresponds to the projection of the cured product, and the projection of the mold corresponds to the groove of the cured product. That is, the projection and groove pattern of the mold is transferred to the imprint material.

As shown in FIG. 5E, when etching is performed using the pattern of the cured product as an etching resistant mask, a portion of the surface of the processed material where the cured product does not exist or remains thin is removed to form a groove. As shown in FIG. 5F, when the pattern of the cured product is removed, an article with the grooves formed in the surface of the processed material can be obtained. The pattern of the cured material is removed here, but, for example, the pattern may be used as a film for insulation between layers included in a semiconductor element or the like without being removed after processing, in other words as a constituent member of the article.

Note that in this embodiment, a circuit pattern transfer mold on which an uneven pattern is formed has been described as the mold 1. The mold 1 may be a mold (plane template) having a plane portion where no uneven pattern is formed. The plane template is used in a planarization apparatus (molding apparatus) that performs planarization processing (molding processing) of performing molding such that a composition on a substrate is planarized by the plane portion. The planarization processing includes a step of curing a curable composition by light irradiation or heating in a state in which the plane portion of the plane template is in contact with the curable composition supplied onto the substrate. As described above, this embodiment can be applied to a molding apparatus configured to mold a composition on a substrate using a plane template.

The underlying pattern on the substrate has an uneven profile derived from the pattern formed in the previous step. In particular, with the recent multilayered structure of a memory element, the substrate (process wafer) may have a step of about 100 nm. The step derived from a moderate undulation of the entire substrate can be corrected by the focus following function of an exposure apparatus (scanner) used in the photolithography step. However, an unevenness with a small pitch fitted in the exposure slit area of the exposure apparatus directly consumes the DOF (Depth Of Focus) of the exposure apparatus. As a conventional technique of planarizing the underlying pattern of a substrate, a technique of forming a planarization layer, such as SOC (Spin On Carbon) or CMP (Chemical Mechanical Polishing), is used. In the conventional technique, however, as shown in FIG. 6A, an unevenness suppressing rate of only 40% to 70% is obtained in the boundary portion between an isolated pattern region A and a repetitive dense (concentration of a line & space pattern) pattern region B, and sufficient planarization performance cannot be obtained. The unevenness difference of the underlying pattern caused by the multilayered structure tends to further increase in the future.

As a solution to this problem, U.S. Pat. No. 9,415,418 proposes a technique of forming a continuous film by application of a resist serving as a planarization layer by an inkjet dispenser and pressing by a plane template. Also, U.S. Pat. No. 8,394,282 proposes a technique of reflecting a topography measurement result on a substrate side on density information for each position to instruct application by an inkjet dispenser. An imprint apparatus 100 can particularly be applied as a planarization processing (planarization) apparatus for performing local planarization in a substrate surface by pressing not the mold 1 but a plane template against an uncured resist applied in advance.

FIG. 6A shows a substrate before planarization processing. In the isolated pattern region A, the area of a pattern convex portion is small. In the repetitive dense pattern region B, the ratio of the area of a pattern convex portion to the area of a pattern concave portion is 1:1. The average height of the isolated pattern region A and the repetitive dense pattern region B changes depending on the ratio of the pattern convex portion.

FIG. 6B shows a state in which the resist that forms the planarization layer is applied to the substrate. FIG. 6B shows a state in which the resist is applied by an inkjet dispenser based on the technique proposed in U.S. Pat. No. 9,415,418. However, a spin coater may be used to apply the resist. In other words, the imprint apparatus 100 can be applied if a step of pressing a plane template against an uncured resist applied in advance to planarize the resist is included.

As shown in FIG. 6C, the plane template is made of glass or quartz that passes UV rays, and the resist is cured by irradiation of UV rays from a light source. For the moderate unevenness of the entire substrate, the plane template conforms to the profile of the substrate surface. After the resist is cured, the plane template is separated from the resist, as shown in FIG. 6D.

Note that the present invention is not limited to a molding apparatus including an imprint apparatus and a planarization apparatus, but is broadly applicable to apparatuses each provided with a mechanism of discharging droplets, the apparatuses including an industrial equipment such as a manufacturing apparatus for manufacturing a semiconductor element, a liquid crystal display element, or the like, and a consumer product such as a printer.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent application No. 2021-096032 filed on Jun. 8, 2021, which is hereby incorporated by reference herein in its entirety.

What is claimed is:

1. A molding apparatus that molds a composition on a substrate using a mold, the apparatus comprising:
   a stage configured to hold the substrate and position the substrate with respect to the mold;
   a dispenser that discharges droplets of the composition to arrange the droplets on the substrate while the stage is holding the substrate;
   a distance measurement sensor configured to measure, after a film of the composition has been formed on the substrate by molding, with the mold, the discharged droplets arranged as a first drop pattern on the substrate, a film thickness of the film of the composition formed on the substrate while the stage is holding the substrate, wherein the film is a continuous film; and
   a control unit including a processor configured to:
      obtain, based on the film thickness measured by the distance measurement sensor, a transition of a volume fluctuation of a droplet of the composition discharged from the dispenser by obtaining a volume of the droplet; and
      feedback-control, based on the transition, the dispenser such that a fluctuation of a volume of droplets discharged from the dispenser, to be arranged as a second drop pattern on the substrate, falls within an allowable range of ±5%.

2. The apparatus according to claim 1, wherein:
   the distance measurement sensor measures a first distance between the distance measurement sensor and a surface of the substrate before discharging the droplets and a second distance between the distance measurement sensor and an upper surface of the film of the composition formed on the substrate, and
   the film thickness is a difference between the first distance and the second distance.

3. The apparatus according to claim 2, wherein:
   the distance measurement sensor measures the first distance for each of a first plurality of portions on the surface of the substrate, and measures the second distance for each of a second plurality of portions of the film of the composition above the first plurality of portions, and the film thickness is a difference between an average value of the first distances at the first plurality of portions and an average value of the second distances at the second plurality of portions.

4. The apparatus according to claim 1, wherein the distance measurement sensor:
   measures a first distance between the distance measurement sensor and a first surface, on a side of the substrate, of the film of the composition formed on the substrate;
   measures a second distance between the distance measurement sensor and a second surface on the opposite side of the first surface of the film of the composition; and
   obtains the film thickness based on the first distance, the second distance, and a refractive index of the composition.

5. The apparatus according to claim 4, wherein the distance measurement sensor:
   measures the first distance for each of a first plurality of portions of the first surface;
   measures the second distance for each of a second plurality of portions of the second surface above the first plurality of portions; and
   obtains the film thickness based on an average value of the first distances at the first plurality of portions, an average value of the second distances at the second plurality of portions, and the refractive index of the composition.

6. The apparatus according to claim 1, wherein the control unit controls, further based on a volatilization amount of the composition from discharging of the droplets of the composition on the substrate to the formation of the film of the composition on the substrate, the volume of the discharged droplets of the composition.

7. The apparatus according to claim 1, wherein the control unit:
   acquires in advance data indicating a relationship between a time from discharging of the droplets of the composition on the substrate to the formation of the film of the composition on the substrate and the film thickness of the film of the composition formed on the substrate; and
   feedback-controls, further based on the data, the dispenser such that the fluctuation of the volume of droplets discharged from the dispenser, to be arranged as the second drop pattern on the substrate, falls within the allowable range.

8. The apparatus according to claim 1, wherein the distance measurement sensor measures the film thickness of the film of the composition in a period after the film of the composition is formed on the substrate held by the stage and before the substrate is unloaded from the stage.

9. The apparatus according to claim 1, wherein:
   the mold includes a pattern, and
   the molding apparatus forms a pattern in the film of the composition on the substrate by bringing the pattern of the mold into contact with the droplets of the composition on the substrate.

10. The apparatus according to claim 1, wherein:
   the mold includes a plane portion, and
   the molding apparatus planarizes the film of the composition on the substrate by bringing the plane portion of the mold into contact with the droplets of the composition on the substrate.

11. A molding method of molding a composition on a substrate using a mold and a stage configured to hold the substrate and position the substrate, the method comprising:

holding and positioning, with the stage, the substrate with respect to the mold;

discharging droplets of the composition from a dispenser to arrange the droplets as a first drop pattern on the substrate while the stage is holding the substrate;

molding, with the mold, the droplets of the composition arranged on the substate and forming a film of the composition on the substrate;

measuring, after the molding, a film thickness of the film of the composition formed on the substrate while the stage is holding the substrate, wherein the film is a continuous film;

obtaining, based on the measured film thickness measured in the measuring, a transition of a volume fluctuation of each discharged a droplet of the composition discharged in the dispensing by obtaining a volume of the droplet; and feedback-controlling, based on the transition, the dispenser such that a fluctuation of a volume of droplets discharged in the dispensing, to be arranged as a second drop pattern on the substrate, falls within an allowable range of ±5%.

12. An article manufacturing method comprising:

molding uncured droplets of a composition arranged on a substrate using a molding apparatus;

processing the substrate on which the composition is molded in the molding; and manufacturing an article from the processed substrate, wherein the molding apparatus comprises:

a mold including a pattern;

a stage configured to hold the substrate and position the substrate with respect to the mold;

a dispenser that discharges droplets of the composition to arrange the droplets on the substrate while the stage is holding the substrate;

a distance measurement sensor configured to measure, after a film of the composition has been formed on the substrate by molding, with the mold, the discharged droplets arranged as a first drop pattern on the substrate, a film thickness of the film of the composition formed on the substrate while the stage is holding the substrate, wherein the film is a continuous film; and a control unit including a processor configured to:

obtain, based on the film thickness measured by the distance measurement sensor, a transition of a volume fluctuation of a droplet of the composition discharged from the dispenser by obtaining a volume of the droplet; and feedback-control, based on the transition, the dispenser such that a fluctuation of a volume of droplets discharged from the dispenser, to be arranged as a second drop pattern on the substrate, falls within an allowable range of ±5%.

13. A molding apparatus that molds a composition on a substrate using a mold, the apparatus comprising:

a dispenser that discharges droplets of the composition to arrange the droplets on the substrate;

a distance measurement sensor configured to measure, after a film of the composition has been formed on the substrate by molding, with the mold, the discharged droplets arranged as a first drop pattern on the substrate, a film thickness of the film of the composition formed on the substrate, wherein the film is a continuous film; and a control unit including a processor configured to:

obtain, based on the film thickness measured by the distance measurement sensor, a transition of a volume fluctuation of a droplet of the composition discharged from the dispenser by obtaining a volume of the droplet; and feedback-control, based on the transition, the dispenser such that a fluctuation of a volume of droplets discharged from the dispenser, to be arranged as a second drop pattern on the substrate, falls within an allowable range of ±5%.

* * * * *